United States Patent
Tourino et al.

(10) Patent No.: US 10,153,388 B1
(45) Date of Patent: Dec. 11, 2018

(54) EMISSIVITY COATING FOR SPACE SOLAR CELL ARRAYS

(71) Applicant: SolAero Technologies Corp., Albuquerque, NM (US)

(72) Inventors: Cory Tourino, Edgewood, NM (US); Dwight Hazlett, Rio Rancho, NM (US); Brian Guzie, Rio Rancho, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 436 days.

(21) Appl. No.: 14/216,607

(22) Filed: Mar. 17, 2014

Related U.S. Application Data (60) Provisional application No. 61/789,324, filed on Mar. 15, 2013.

(51) Int. Cl.
*H02N 6/00* (2006.01)
*H01L 31/042* (2014.01)
*H01L 31/04* (2014.01)
*H01L 31/18* (2006.01)

(52) U.S. Cl.
CPC .......... *H01L 31/0413* (2013.01); *H01L 31/18* (2013.01)

(58) Field of Classification Search
CPC .................................. H01L 31/0475
USPC ......................................... 136/251
See application file for complete search history.

(56) References Cited

U.S. PATENT DOCUMENTS 3,411,050 A * 11/1968 Hill ................. H01L 21/00
136/244

| | | |
|---|---|---|
| 3,488,834 A | 1/1970 | Baird |
| 3,964,155 A | 6/1976 | Leinkram et al. |
| 4,001,864 A | 1/1977 | Gibbons |
| 4,255,211 A | 3/1981 | Fraas |
| 4,338,480 A | 7/1982 | Antypas et al. |
| 4,393,576 A | 7/1983 | Dahlberg |
| 4,612,408 A | 9/1986 | Moddel et al. |
| 4,759,803 A | 7/1988 | Cohen |
| 4,881,979 A | 11/1989 | Lewis |
| 5,009,720 A | 4/1991 | Hokuyo et al. |
| 5,019,177 A | 5/1991 | Wanlass |
| 5,021,360 A | 6/1991 | Melman et al. |
| 5,053,083 A | 10/1991 | Sinton |
| 5,217,539 A | 6/1993 | Fraas et al. |
| 5,298,085 A | 3/1994 | Harvey et al. |
| 5,322,572 A | 6/1994 | Wanlass |

(Continued)

FOREIGN PATENT DOCUMENTS

EP 1 109 230 A2 6/2001
EP 1 863 099 A2 12/2007

(Continued)

OTHER PUBLICATIONS

Silverman, "Space Environmental Effects on Spacecraft: LEO Materials Selection Guide," NASA Contractor Report 4661, Part 1, Aug. 1995. (Year: 1995).*

(Continued)

*Primary Examiner* — Angelo Trivisonno (57) ABSTRACT

The present disclosure provides a solar cell array for deployment and use in a space environment, and methods of making same. The array includes a plurality of solar cells having an emissivity coating on the baskside of each, with each coated solar cell being attached to a supporting member.

12 Claims, 5 Drawing Sheets

(56) References Cited

U.S. PATENT DOCUMENTS

| | | |
|---|---|---|
| 5,342,453 A | 8/1994 | Olson |
| 5,376,185 A | 12/1994 | Wanlass |
| 5,405,453 A | 4/1995 | Ho et al. |
| 5,479,032 A | 12/1995 | Forrest et al. |
| 5,510,272 A | 4/1996 | Morikawa et al. |
| 5,928,437 A | 7/1999 | Dillard |
| 5,944,913 A | 8/1999 | Hou et al. |
| 6,103,970 A | 8/2000 | Kilmer et al. |
| 6,162,987 A | 12/2000 | Murray et al. |
| 6,165,873 A | 12/2000 | Hamada |
| 6,180,432 B1 | 1/2001 | Freeouf |
| 6,239,354 B1 | 5/2001 | Wanlass |
| 6,252,287 B1 | 6/2001 | Kurtz et al. |
| 6,278,054 B1 | 8/2001 | Ho et al. |
| 6,281,426 B1 | 8/2001 | Olson et al. |
| 6,300,557 B1 | 10/2001 | Wanlass |
| 6,300,558 B1 | 10/2001 | Takamoto et al. |
| 6,313,396 B1 | 11/2001 | Glenn |
| 6,316,716 B1 | 11/2001 | Hilgrath |
| 6,326,540 B1 | 12/2001 | Kilmer et al. |
| 6,340,788 B1 | 1/2002 | King et al. |
| 6,359,210 B2 | 3/2002 | Ho et al. |
| 6,372,980 B1 | 4/2002 | Freundlich |
| 6,452,086 B1 | 9/2002 | Muller |
| 6,482,672 B1 | 11/2002 | Hoffman et al. |
| 6,600,100 B2 | 7/2003 | Ho et al. |
| 6,660,928 B1 | 12/2003 | Patton et al. |
| 6,680,432 B2 | 1/2004 | Sharps et al. |
| 6,690,041 B2 | 2/2004 | Armstrong et al. |
| 6,794,631 B2 | 9/2004 | Clark |
| 6,815,736 B2 | 11/2004 | Mascarenhas |
| 6,864,414 B2 | 3/2005 | Sharps et al. |
| 6,951,819 B2 | 10/2005 | Iles et al. |
| 7,071,407 B2 | 7/2006 | Faterni et al. |
| 7,115,811 B2 | 10/2006 | Ho et al. |
| 7,119,271 B2 | 10/2006 | King et al. |
| 7,122,733 B2 | 10/2006 | Narayanan et al. |
| 7,122,734 B2 | 10/2006 | Fetzer et al. |
| 7,166,520 B1 | 1/2007 | Henley |
| 7,339,109 B2 | 3/2008 | Stan et al. |
| 7,727,795 B2 | 6/2010 | Stan et al. |
| 7,741,146 B2 | 6/2010 | Cornfeld et al. |
| 7,759,572 B2 | 7/2010 | Sharps et al. |
| 7,785,989 B2 | 8/2010 | Sharps et al. |
| 7,812,249 B2 | 10/2010 | King et al. |
| 7,842,881 B2 | 11/2010 | Cornfeld et al. |
| 7,846,759 B2 | 12/2010 | Atwater, Jr. et al. |
| 7,960,201 B2 | 6/2011 | Cornfeld et al. |
| 8,039,291 B2 | 10/2011 | Cornfeld et al. |
| 8,067,687 B2 | 11/2011 | Wanlass |
| 8,187,907 B1 | 5/2012 | Newman |
| 8,227,689 B2 | 7/2012 | King et al. |
| 8,236,600 B2 | 8/2012 | Cornfeld |
| 8,263,853 B2 | 9/2012 | Varghese |
| 8,263,856 B2 | 9/2012 | Cornfeld et al. |
| 8,536,445 B2 | 9/2013 | Cornfeld et al. |
| 2002/0164834 A1 | 11/2002 | Boutros et al. |
| 2003/0070707 A1 | 4/2003 | King et al. |
| 2004/0149331 A1 | 8/2004 | Sharps et al. |
| 2005/0211291 A1 | 9/2005 | Bianchi |
| 2005/0272175 A1 | 12/2005 | Meier et al. |
| 2006/0021565 A1 | 2/2006 | Zahler et al. |
| 2006/0162768 A1 | 7/2006 | Wanlass et al. |
| 2006/0185582 A1 | 8/2006 | Atwater, Jr. et al. |
| 2007/0137694 A1 | 6/2007 | Foster et al. |
| 2007/0218649 A1 | 9/2007 | Hernandez |
| 2008/0029151 A1 | 2/2008 | McGlynn et al. |
| 2008/0149173 A1 | 6/2008 | Sharps |
| 2008/0185038 A1 | 8/2008 | Sharps |
| 2008/0245409 A1 | 10/2008 | Varghese et al. |
| 2009/0038679 A1 | 2/2009 | Varghese et al. |
| 2009/0078308 A1 | 3/2009 | Varghese et al. |
| 2009/0078309 A1 | 3/2009 | Cornfeld et al. |
| 2009/0078310 A1 | 3/2009 | Stan et al. |
| 2009/0078311 A1 | 3/2009 | Stan et al. |
| 2009/0155952 A1 | 6/2009 | Stan et al. |
| 2009/0188546 A1 | 7/2009 | McGlynn et al. |
| 2009/0223554 A1 | 9/2009 | Sharps |
| 2009/0229658 A1 | 9/2009 | Stan et al. |
| 2009/0229662 A1 | 9/2009 | Stan et al. |
| 2009/0272430 A1 | 11/2009 | Cornfeld et al. |
| 2009/0272438 A1 | 11/2009 | Cornfeld |
| 2009/0288703 A1 | 11/2009 | Stan et al. |
| 2009/0301544 A1* | 12/2009 | Minelli ............... H01L 31/048 136/244 |
| 2009/0314348 A1 | 12/2009 | McGlynn et al. |
| 2010/0012174 A1 | 1/2010 | Varghese et al. |
| 2010/0012175 A1 | 1/2010 | Varghese et al. |
| 2010/0047959 A1 | 2/2010 | Cornfeld et al. |
| 2010/0093127 A1 | 4/2010 | Sharps et al. |
| 2010/0109115 A1 | 5/2010 | Ure |
| 2010/0122724 A1 | 5/2010 | Cornfeld et al. |
| 2010/0122764 A1 | 5/2010 | Newman |
| 2010/0147366 A1 | 6/2010 | Stan et al. |
| 2010/0186804 A1* | 7/2010 | Cornfeld ........... H01L 31/02021 136/255 |
| 2010/0203730 A1 | 8/2010 | Cornfeld et al. |
| 2010/0206365 A1 | 8/2010 | Chumney et al. |
| 2010/0212720 A1* | 8/2010 | Meyer ........................ F24J 2/16 136/246 |
| 2010/0229913 A1 | 9/2010 | Cornfeld |
| 2010/0229926 A1 | 9/2010 | Newman et al. |
| 2010/0229932 A1 | 9/2010 | Cornfeld et al. |
| 2010/0229933 A1 | 9/2010 | Cornfeld |
| 2010/0233838 A1 | 9/2010 | Varghese |
| 2010/0236615 A1 | 9/2010 | Sharps |
| 2010/0282288 A1 | 11/2010 | Cornfeld |
| 2011/0041898 A1 | 2/2011 | Cornfeld |
| 2011/0226333 A1* | 9/2011 | Abusleme ............... C08L 27/12 136/259 |
| 2012/0024353 A1* | 2/2012 | Ge ........................ H01L 31/048 136/251 |
| 2012/0211047 A1 | 8/2012 | Cornfeld |

FOREIGN PATENT DOCUMENTS

| | | |
|---|---|---|
| EP | 0 658 944 B1 | 4/2009 |
| FR | 2 878 076 A1 | 5/2006 |
| GB | 2 346 010 A | 7/2000 |
| JP | 60-160181 | 8/1985 |
| JP | 09-64397 | 3/1997 |
| WO | WO 96/18213 A1 | 6/1996 |
| WO | WO 99/62125 A1 | 12/1999 |
| WO | WO 2005/015638 A1 | 2/2005 |

OTHER PUBLICATIONS

U.S. Appl. No. 12/265,113, filed Nov. 5, 2008, Varghese.
U.S. Appl. No. 12/708,361, filed Feb. 18, 2010, Cornfeld et al.
U.S. Appl. No. 12/716,814, filed Mar. 3, 2010, Cornfeld.
U.S. Appl. No. 12/730,018, filed Mar. 23, 2010, Cornfeld.
U.S. Appl. No. 12/756,926, filed Apr. 8, 2010, Cornfeld.
U.S. Appl. No. 12/813,408, filed Jun. 10, 2010, Patel et al.
U.S. Appl. No. 12/844,673, filed Jul. 27, 2010, Stan et al.
Advisory Action dated Mar. 15, 2011. U.S. Appl. No. 11/445,793.
Aiken et al., "Consideration of High Bandgap Subcells for Advanced Multijunction Solar Cells," Conference Record of the 2006 IEEE 4th World Conference on Photovoltaic Energy Conversion; May 1, 2006, pp. 838-841.
Cornfeld et al., "Development of a Large Area Inverted Metamorphic Multi-junction (IMM) Highly Efficient AM0 Solar Cell," 33rd IEEE Photovoltaic Specialists Conference, May 11-16, 2008, San Diego, CA, USA; 5 pgs.
Cornfeld et al., "Development of a Large Area Inverted Metamorphic Multi-junction Highly Efficient AM0 Solar Cell," Conference paper presented at the 33rd IEEE Photovoltaic Specialists Conference (May 11-16, 2008) on May 12, 2008. San Diego, CA, USA; 17 pages.
Cornfeld et al., "Advances in the Performance of Inverted Metamorphic Multi-junction Solar Cells." 23rd European Photovoltaic Energy Conference, Sep. 1-5, 2008, Valencia, Spain.

(56) References Cited

OTHER PUBLICATIONS

Friedman et al., "0.7-eV GaInAs Junction for a GaInP/GaAs/GaInAs(1eV)/GaInAs(0.7eV) Four-Junction Solar Cell," 2006 IEEE 4th World Conference on Photovoltaic Energy Conversion, May 7-12, 2006, Waikoloa, Hawaii, USA; 5 pgs.
Geisz et al., "High-efficiency GaInP/GaAs/InGaAs triple junction solar cells grown inverted with a metamorphic bottom junction," *Applied Physics Letters*, 2007; 91(023502):023502-1-023502-3. Online publication Jul. 10, 2007. American Institute of Physics, Melville, NY, USA.
Geisz, et al., "Inverted GaInP/(In)GaAs/InGaAs Triple-Junction Solar Cells with Low-Stress Metamorphic Bottom Junctions," 33rd IEEE Photovoltaic Specialists Conference, May 11-16, 2008, San Diego, CA, USA; 5 pgs.
King et al., "Next-Generation, High-Efficiency III-V Multijunction Solar Cells," 28th IEEE Photovoltaic Specialists Conference, Sep. 15-22, 2000, Anchorage, AK, USA; pp. 998-1001.
King et al., "High-Efficiency Space and Terrestrial Multijunction Solar Cells Through Bandgap Control in Cell Structures," 2002 Photovoltaic Specialists Conference, Conference Record of the 29th IEEE, May 19-24, 2002, New Orleans, LA, USA; pp. 776-781.
Lewis et al., "The Crystallographic Connection of MOCVD-Grown Monolithic Cascade Subcells Via Transparent Graded Layers," Journal of Crystal Growth, 1984; 69:515-526.
Lewis et al., "Recent Developments in Multijunction Solar Cell Research," *Solar Cells*, 1988; 24:171-183.
Office Action dated Jan. 4, 2011. U.S. Appl. No. 11/445,793. (Sexl reference, double patenting rejection); 38 pgs.
Partial European Search Report for European Patent Application No. 08 01 3466 dated Feb. 12, 2009; 3 pgs.
Rule 132 Declaration of Mark W. Wanlass, U.S. Appl. No. 11/027,156, dated Jul. 31, 2010; 32 pgs.
Rule 132 Declaration of Noren Pan, U.S. Appl. No. 11/027,156, dated Nov. 4, 2010; 5 pgs.
Rule 132 Declaration of Rama Venkatsubramanian, U.S. Appl. No. 11/027,156, dated Nov. 9, 2010; 17 pgs.
Rule 132 Declaration of Sarah Kurtz, U.S. Appl. No. 11/027,156, dated Jul. 31, 2010.
Schultz et al., "High Efficiency 1.0 eV GaInAs Bottom Solar Cell for 3-junction Monolithic Stack," Conference Record of the 21st IEEE Photovoltaic Specialists Conference, May 21-25, 1990 Kissimmee, Florida. New York: The Institute of Electrical and Electronics Engineers, Inc.; pp. 148-152.
Search Report for European Patent Application No. 06 02 4750.9 dated Oct. 26, 2012; 4 pgs.
Search Report for European Patent Application No. 08 01 3466 dated Dec. 18, 2009; 4 pgs.
Sexl et al., "MBE Growth of Metamorphic In(Ga)AIAs Buffers," 1997 IEEE International Symposium on Compound Semiconductors, Sep. 1997; IEEE, Piscataway, NJ; pp. 49-52.
Sharps et al., "Inverting the triple junction improves efficiency and flexibility," *Compound Semiconductor*, Oct. 2007; 13(9):25-28.
Sinharoy et al., "Progress in the Development of Metamorphic Multi-junction III-V Space Solar Cells," *Progress in Photovoltaics: Research and Applications*, Feb. 2002; 10:427-432.
Stan et al., "Recent Advances in the Performance of Multi-Junction Space Solar Cells," 22nd European Photovoltaic Solar Energy Conference, Sep. 3-7, 2007, Milan, Italy; pp. 101-105.
Stan et al., "Very High Efficiency Triple Junction Solar Cells by MOVPE." 14th International Conference of Metalorganic Vapor Phase Epitaxy. Jun. 1-6, 2008, Metz, France; 32 pgs.
Stan, et al., "High-efficiency quadruple junction solar cells using OMVPE with inverted metamorphic device structures." *Journal of Crystal Growth*, 2010; 312:1370-1374.
Takamoto, et al., "Future Development of InGaP/(In)GaAs Based Multijunction Solar Cells," Proceedings of the 31st IEEE PVSC, Jan. 3-7, 2005, Lake Buena Vista, FL; pp. 519-524.
Takamoto et al., "InGaP/GaAs-based Multijunction Solar Cells," *Progress in Photovoltaics: Research and Applications*, 2005; 13:495-511.
Venkatasubramanian et al., "An Inverted-Growth Approach to Development of an IR-Transparent, High-Efficiency AlGaAs/GaAs Cascade Solar Cell," 22nd IEEE Photovoltaic Specialists Conference, Oct. 7-11,1991, Las Vegas, NV; pp. 93-98.
Venkatasubramanian et al., "High-quality eutectic-metal-bonded AlGaAs—GaAs thin films on Si substrates," *Applied Physics Letters*, Feb. 17, 1992; 60(7):886-888.
Wanlass et al., "Lattice-Mismatched Approaches for High-Performance, III-V Photovoltaic Energy Converters," Proceedings of the 31st IEEE PVSC, Jan. 3-7, 2005, Lake Buena Vista, FL, USA; pp. 530-535.
Wanlass et al., "Monolithic, Ultra-Thin GaInP/GaAs/GaInAs Tandem Solar Cells," 2006 IEEE World Conference on Photovoltaic Energy Conversion, May 7-12, 2006, Waikoloa, Hawaii, USA; pp. 729-732.
White et al., "Development of an Ultraflex-Based Thin Film Solar Array for Space Applications," 3rd World Conference on Photovoltaic Energy Conversion, May 11-18, 2003, Osaka, Japan; pp. 793-796.
Würfel, *Physics of Solar Cells: from Basic Principles to Advanced Concepts, 2nd Updated and Expanded Edition*, 2009. Sections 6.4, 6.5 and 6.8; 20 pages. Wiley-VCH, Weinheim, Germany.
Yamaguchi, "Physics and Technologies of Superhigh-Efficiency Tandem Solar Cells," *Semiconductors*, Sep. 1999; 33(9):961-964.
Yoon et al., "Progress of Inverted Metamorphic III-V Solar Cell Development at Spectrolab," 33rd IEEE Photovoltaic Specialists Conference, May 11-16, 2008, San Diego, CA, USA; 6 pgs.

\* cited by examiner

EMISSIVITY COATING FOR SPACE SOLAR CELL ARRAYS

This application claims the benefit of Provisional Application No. 61/789,324, filed Mar. 15, 2013, which is incorporated herein by reference in its entirety.

REFERENCE TO RELATED APPLICATIONS

This application is related to co-pending U.S. patent application Ser. No. 13/440,331 filed Apr. 5, 2012, herein incorporated by reference.

BACKGROUND OF THE INVENTION

1. Field of the Invention

The present disclosure relates to space solar cells and the assembly of arrays of such solar cells, and more particularly the design and specification and application of the backside coating layer for use on multijunction solar cells based on III-V semiconductor compounds mounted on an array assembly which exposes the backside to the space environment.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500X), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

The efficiency of energy conversion, which converts solar energy (or photons) to electrical energy, depends on various factors such as the design of solar cell structures, the choice of semiconductor materials, and the thickness of each cell. In short, the energy conversion efficiency for each solar cell is dependent on the optimum utilization of the available sunlight across the solar spectrum. As such, the characteristic of sunlight absorption in semiconductor material, also known as photovoltaic properties, is critical to determine the most efficient semiconductor to achieve the optimum energy conversion.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The individual solar cells or wafers are then disposed in horizontal arrays, with the individual solar cells connected together in an electrical series and/or parallel circuit. The shape and structure of an array, as well as the number of cells it contains, are determined in part by the desired output voltage and current. One such array is a mesh such as depicted in U.S. patent application Ser. No. 13/440,331 filed Apr. 5, 2012.

The energy conversion efficiency of multijunction solar cells is affected by such factors as the number of subcells, the thickness of each subcell, and the band structure, electron energy levels, conduction, and absorption of each subcell. Factors such as the short circuit current density ($J_{sc}$), the open circuit voltage ($V_{oc}$), and the fill factor are also important. The temperature of operation of the solar cell is also important, and the use of coatings on the surfaces of the solar cell must be appropriately selected to achieve both suitable reflectivity (i.e., low absorbance from direct sunlight) and emissivity (i.e., the ability to transfer internally generated heat to the surrounding environment).

SUMMARY OF THE INVENTION

Briefly, and in general terms, the present disclosure provides a method of providing an emissive coating on the back side of a solar cell array for deployment and use in a space environment, comprising: providing a plurality of solar cells, each having a front surface and a backside surface, wherein each backside surface is entirely covered with a metallic layer; masking a portion of each backside surface; applying a coating material over each masked backside surface with an emissive coating material to coat each masked backside and provide a plurality of solar cells having an emissive coating thereon; and attaching the plurality of coated solar cells to a supporting member to provide an array of coated solar cells, wherein the supporting member configures the solar cells such that at least a portion of each exposed coated backside surface is exposed to the space environment when deployed. In some embodiments, when exposed to sunlight, the temperature of the array of coated solar cells is lower than the temperature of an array of uncoated solar cells due to the emissivity of the coating. In some embodiments, the efficiency of the array of coated solar cells is higher than the efficiency of a similar array having uncoated solar cells.

In some embodiments, the solar cell is a III-V compound semiconductor multijunction solar cell.

In some embodiments, the solar cell is a III-V compound semiconductor inverted metamorphic multijunction solar cell.

In some embodiments, the supporting member is a mesh.

In some embodiments, the supporting member is a perforated support, with the front and back of the solar cells exposed to the ambient through the perforations.

In some embodiments, the supporting member is a flexible perforated support, with the front and back of the solar cells exposed to the ambient through the perforations.

In some embodiments, the metallic backside layer is a sequence of layers composed of Ti/Au/Ag/Au.

In some embodiments, the coating layer is composed of a material containing 10% titanium dioxide.

In some embodiments, the coating layer is composed of a material containing 10% amorphous silica.

In some embodiments, the coating layer is composed of a white silicone dispersion material in a petroleum ether such as VM&P Naphtha.

In some embodiments, the coating layer is cured for a period of at least seven days following application.

In some embodiments, the coating layer is composed of a material containing a controlled volatility RTV silicone atomic oxygen protective overcoat material such as those available from NuSil Technology LLC (Carpinteria, Calif.).

In some embodiments, the coating layer is composed of a material containing a controlled volatility RTV silicone atomic oxygen protective overcoat material such as the product available under the trade designation CV3-1144-1 from NuSil Technology LLC (Carpinteria, Calif.).

In another aspect, the present disclosure further comprises providing a discrete interconnection member to provide an electrical connection between adjacent solar cells in the array.

In some embodiments, the discrete interconnection member is a planar rectangular clip having a first end-portion welded to the metal contact layer, a second portion connected to the first end-portion and extending above the surface of the solar cell, and a third portion connected to the second portion and being serpentine in shape, and further comprising subsequently attaching a cover glass over the side of the solar cell having the metal grid lines and the attached interconnection member.

In some embodiments, the present disclosure further comprises welding the third portion of the metal interconnection member to a terminal of opposite polarity of an adjacent solar cell to thereby form an electrical series connection.

In some embodiments, the metal electrode layer has a coefficient of thermal expansion within a range of 0 to 10 ppm per degree Kelvin different from that of the adjacent semiconductor material of the semiconductor solar cell. The metal electrode layer is a multilayer stack. Most of the metals in the stack do not fall within 10 ppm/K coefficient of thermal expansion (CTE) range of the semiconductor.

In some embodiments, the metal electrode layer includes molybdenum, an Fe-Ni alloy, and/or a Ni-Co-Fe alloy (such as those available under the trade designation Kovar from Carpenter Technology Corporation, Wyomissing, Pa.), which may be suitably CTE matched to the semiconductor material.

In some embodiments, the metal electrode layer includes a sequence of layers including Ti/Au/Ag/Au or Ti/Mo/Ni/Au, among other sequences of layers in the metal electrode layer.

In some embodiments, the attaching step of the interconnection member is performed by welding. In some embodiments, the welding step utilizes AuGe, AuSn, PbSn, SnAgCu (SAC)-solders.

In some embodiments, the attaching step of the interconnection member is performed by adhesive bonding utilizing Ag or C-loaded polymide/ or B-stage epoxies.

In some embodiments, the metal interconnection member is composed of molybdenum, a nickel-cobalt ferrous alloy, or a nickel iron alloy material.

In some embodiments, in which the solar cell is a III-V compound semiconductor inverted metamorphic multijunction solar cell, the present disclosure further comprises the step of depositing a sequence of layers on a growth substrate, including forming a first subcell comprising a first semiconductor material with a first band gap and a first lattice constant; forming a second subcell comprising a second semiconductor material with a second band gap and a second lattice constant, wherein the second band gap is less than the first band gap and the second lattice constant is greater than the first lattice constant; and forming a lattice constant transition material positioned between the first subcell and the second subcell, said lattice constant transition material having a lattice constant that changes gradually from the first lattice constant to the second lattice constant.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWING

The invention will be better and more fully appreciated by reference to the following detailed description when considered in conjunction with the accompanying drawings, wherein.

DESCRIPTION OF ILLUSTRATIVE EMBODIMENTS

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The present disclosure provides a process for coating a backside of a solar cell, and permanently mounting a solar cell on a perforated support, such as a flexible mesh support, and providing an electrical interconnect member for connecting each cell to adjacent cells. More specifically, the present disclosure intends to provide a relatively simple and reproducible technique that is suitable for use in a high volume production environment in which various semiconductor layers are deposited in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

Figure 1:
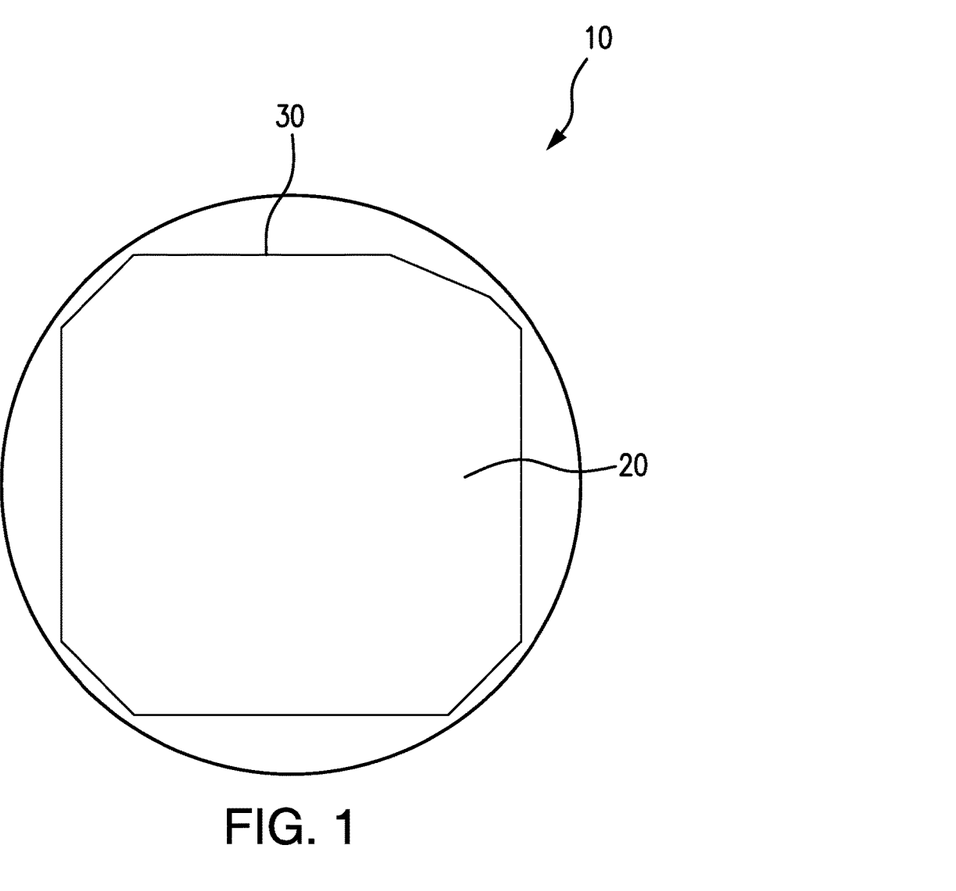
FIG. 1 is a top view of the solar cell in one embodiment of the present disclosure as the solar cell is scribed after being fabricated on a wafer.

FIG. 1 is a top view of a wafer 10 in which a solar cell 20 according to one embodiment of the present disclosure is fabricated on wafer 10. After fabrication, the solar cell 20 can be scribed from the wafer as illustrated by scribe marks 30.

Figure 2:
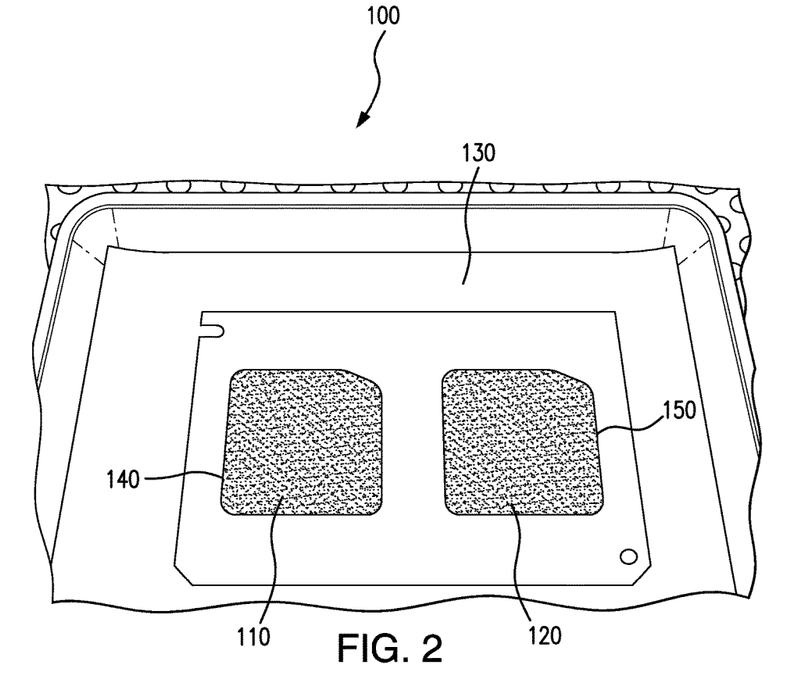
FIG. 2 is a top view of the backside of two solar cells in the configuration of those of FIG. 1 together with a mask overlying the peripheral edges of the solar cell in one embodiment of the present disclosure during an initial stage of fabrication prior to the deposition of the coating layer.

FIG. 2 is a top view of solar cells 100 of one embodiment of the present disclosure during an initial stage of fabrication prior to the deposition of the coating layer. FIG. 2 shows the backside of two solar cells (110, 120) as illustrated in FIG. 1 together with mask 130 overlying the peripheral edges (140, 150) of solar cells 110 and 120, respectively.

A wide variety of coating materials can be used to prepare the coating layer. Suitable coating materials can include silicones such as room temperature vulcanizable (RTV) silicones, and particularly RTV silicones compounded with pigments (e.g., $TiO_2$ and/or $SiO_2$) to be white. Exemplary RTV silicone coating materials may include an oxime cure system that allows the material to cure at room temperature over a period of about seven days. Suitable RTV silicones are available under the trade designation CV#-1144-1 from NuSil Technology LLC (Carpinteria, Calif.), which are controlled volatility materials that can provide atomic oxygen protective overcoats.

Figure 3:
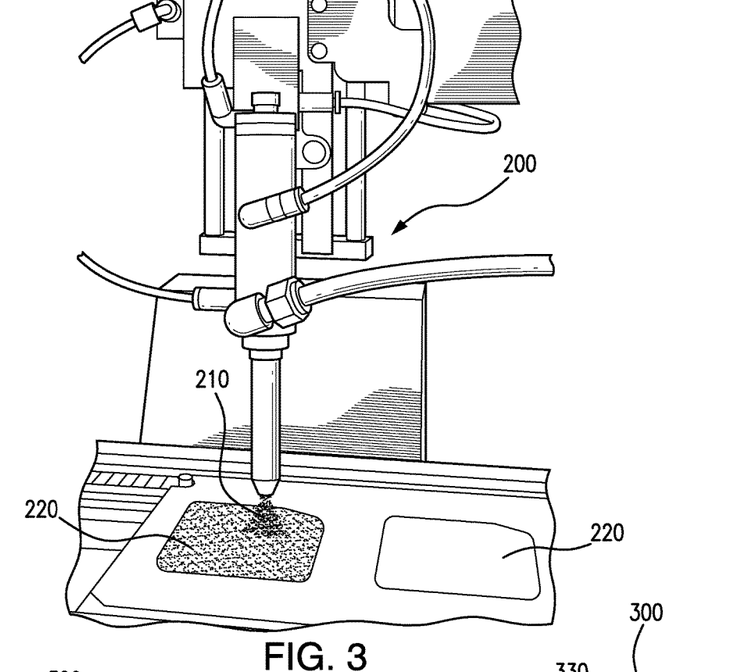
FIG. 3 is a depiction of the operation of spraying of the coating layer on the masked solar cells.

The coating material can be applied to the masked solar cells by a wide variety of methods including, for example, roll coating, bar coating, electrostatic coating, and spray coating. For some embodiments, the coating material can be conveniently sprayed on the masked solar cells. FIG. 3 is a depiction of an exemplary embodiment illustrating an apparatus 200 for spraying the coating material 210 on the masked solar cells 220.

Figure 4:
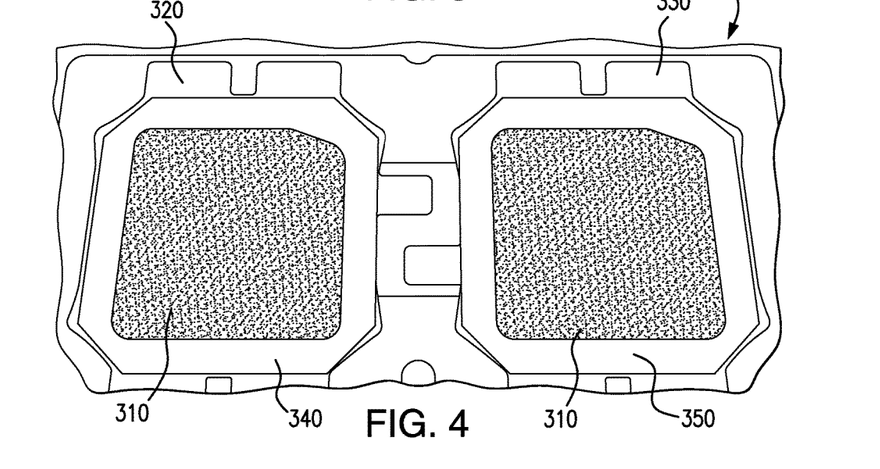
FIG. 4 is a top view of the backside of two solar cells after the spraying operation and the removal of the mask.

FIG. 4 is a top view of the backside of two solar cells 300 after the spraying operation and the removal of the mask. The emissive coating 310 is shown by the stipled portion of solar cells 300, with the uncoated portions 340 and 350 representing the back metal. The tabs 320 and 330 on the top and sides of the solar cells represent interconnects.

Figure 5:
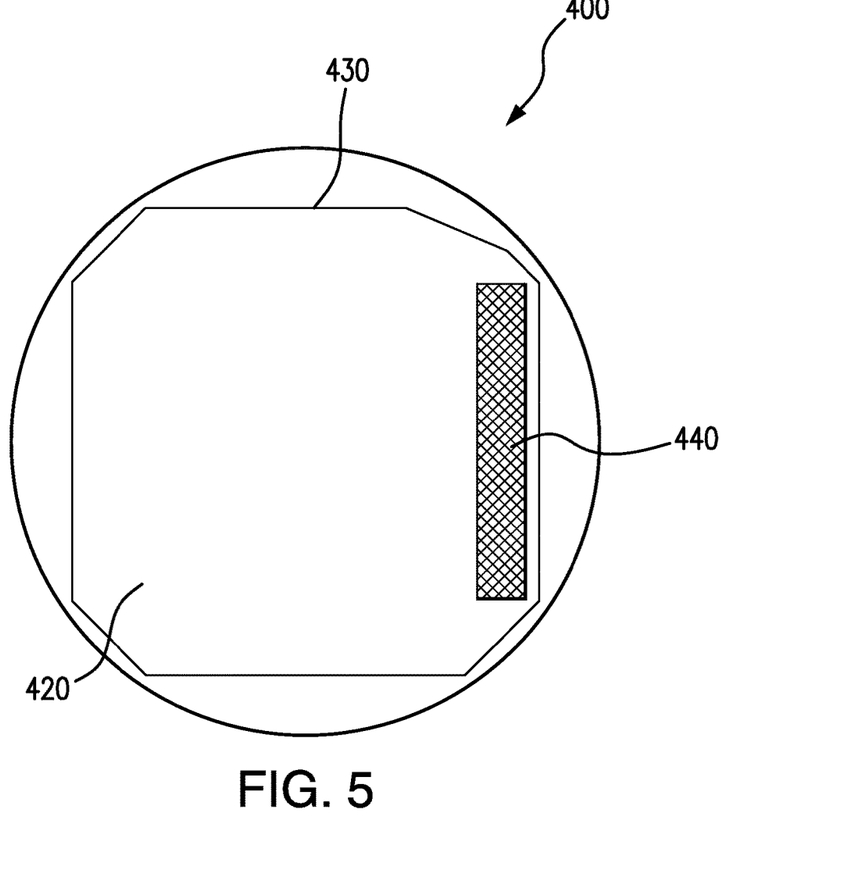
FIG. 5 is a top view of the solar cell in one embodiment of the present disclosure prior to the solar cell being scribed from the wafer.

FIG. 5 is a top view of a wafer 400 in which a solar cell 420 according to one embodiment of the present disclosure is fabricated on wafer 400. After fabrication, the solar cell 420 can be scribed from the wafer as illustrated by scribe marks 430. Prior to solar cell 420 being scribed from the wafer, and interconnect can be attached to the solar cell at the shadowed region 440.

Figure 6A:
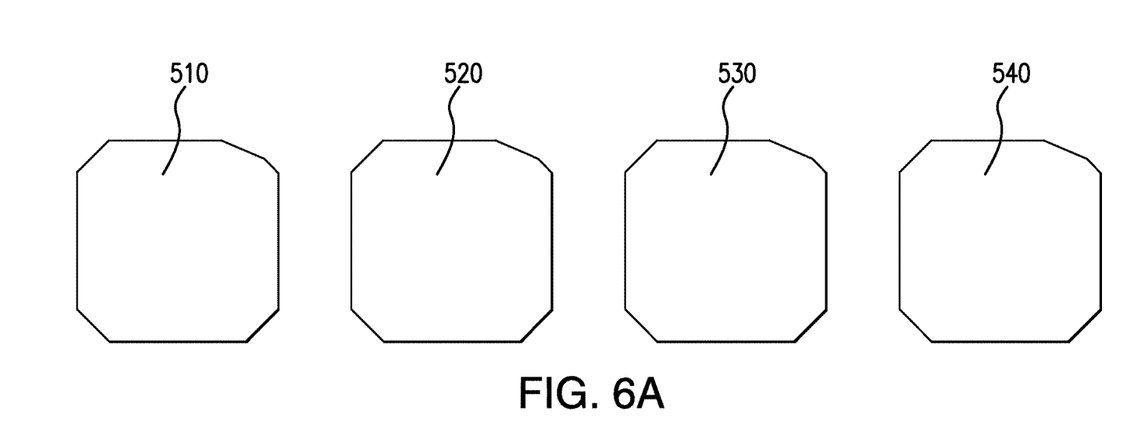
FIG. 6A is a top view of an array of four solar cells prior to being mounted on a first supporting member.

FIG. 6A is a top view of an array of four solar cells (510, 520, 530, 540) prior to being mounted on a first supporting member. The interconnect is not depicted in order to simplify the drawing. In some embodiments the interconnect may be welded or attached to the cells after the solar cells have been separated from the wafer, and before the solar cells are positioned, aligned, and adhered to the surface of a perforated carrier or support. In other embodiments, the solar cells may be mounted on the carrier without the interconnect, and the interconnect welded to the cells while on the carrier.

Figure 6B:
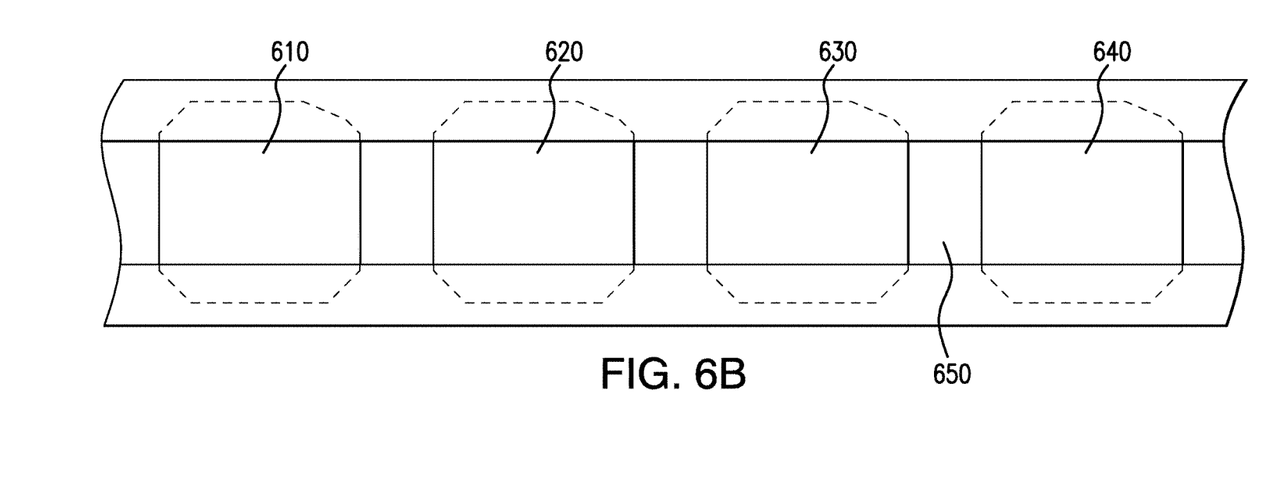
FIG. 6B is a top view of an array of four solar cells after being mounted on a first supporting member in the X direction.

FIG. 6B is a top view of an array of four solar cells (610, 620, 630, 640) after being mounted on a first supporting member 650 in the X direction. Similar arrays can be stacked in horizontal arrays and a second supporting member used in the Y direction to form a mesh. In one embodiment, the mesh may be formed with square shaped perforations, with the dimensions of each square shaped aperture being approximately 0.25 cm. The mesh can be formed from a wide variety of mesh materials such as those available under the trade designation Ultratech from Volm Companies, Inc. (Antigo, Wis.). A mesh material available under the trade designation UltraMesh from Ultraflex Ssytems Incorporated (Randolph, N.J.) can be used as the finished support platform for the solar cell array. The interconnect is not depicted in order to simplify the drawing.

A variety of different features and aspects of multijunction solar cells are disclosed in the related applications noted above. Some or all of such features may be included in the structures and processes associated with the solar cells of the present invention. Neither, some or all of such aspects may be included in the structures and processes associated with the semiconductor devices and/or solar cells of the present invention.

What is claimed is:

1. A solar cell array for deployment and use in a space environment comprising a plurality of coated III-V compound semiconductor multijunction solar cells attached to a flexible supporting member to provide an array comprising the plurality of coated III-V compound semiconductor multijunction solar cells;

wherein each solar cell of the plurality of solar cells is a space solar cell designed for operation at AM0;

wherein each solar cell of the plurality of coated III-V compound semiconductor multijunction solar cells has a front surface and a backside surface, wherein each backside surface is entirely covered with a metallic backside layer having an emissive coating formed from a coating material comprising a room temperature vulcanizable (RTV) silicone compounded to provide a white silicone emissive coating directly on a portion of the metallic backside layer;

wherein the supporting member configures each solar cell of the plurality of coated III-V compound semiconductor multijunction solar cells such that at least a portion of each exposed coating on the backside layer is exposed to the space environment when deployed; and wherein, when exposed to sunlight, the array comprising the plurality of coated III-V compound semiconductor multijunction solar cells has a temperature that is lower than a temperature of an array comprising a plurality of uncoated III-V compound semiconductor multijunction solar cells due to the emissivity of the emissive coating.

2. The solar cell array of claim 1 wherein the array comprising the plurality of coated III-V compound semiconductor multijunction solar cells has an efficiency that is higher than an efficiency of an array comprising a plurality of uncoated III-V compound semiconductor multijunction solar cells.

3. The solar cell array of claim 1 wherein the room temperature vulcanizable (RTV) silicone is compounded with $TiO_2$ and/or $SiO_2$.

4. The solar cell array of claim 1 wherein the coating material is applied by spraying.

5. The solar cell array of claim 1 wherein the emissive coating is cured at room temperature for at least seven days following application.

6. The solar cell array of claim 1 wherein each coated III-V compound semiconductor multijunction solar cell is an inverted metamorphic multijunction solar cell.

7. The solar cell array of claim 1 wherein the supporting member is a mesh.

8. The solar cell array of claim 1 wherein the metallic backside layer is a sequence of layers composed of Ti/Au/Ag/Au.

9. The solar cell array of claim 1 further comprising a discrete interconnection member to provide an electrical connection between adjacent coated III-V compound semiconductor multijunction solar cells in the array.

10. A solar cell array for deployment and use in a space environment comprising a plurality of coated III-V compound semiconductor inverted metamorphic multijunction solar cells attached to a flexible supporting member to provide an array comprising the plurality of coated III-V compound semiconductor inverted metamorphic multijunction solar cells and further comprising a discrete interconnection member to provide an electrical connection between adjacent coated III-V compound semiconductor inverted metamorphic multijunction solar cells;

wherein each solar cell of the plurality of solar cells is a space solar cell designed for operation at AM0;

wherein each solar cell of the plurality of coated III-V compound semiconductor inverted metamorphic multijunction solar cells has a front surface and a backside surface, wherein each backside surface is entirely covered with a metallic backside layer comprising a sequence of layers composed of Ti/Au/Ag/Au, and further comprising an emissive coating directly on a portion of the metallic backside layer, wherein the emissive coating is formed from a coating material comprising a white room temperature vulcanizable (RTV) silicone compounded with $TiO_2$ and/or $SiO_2$ that is spray coated and cured at room temperature for at least seven days following application;

wherein the supporting member is a mesh that configures each solar cell of the plurality of coated III-V compound semiconductor inverted metamorphic multijunction solar cells such that at least a portion of each exposed coating on the backside layer is exposed to the space environment when deployed; and wherein when exposed to sunlight, the array comprising the plurality of coated III-V compound semiconductor inverted metamorphic multijunction solar cells has a temperature that is lower than a temperature of an array comprising a plurality of uncoated III-V compound semiconductor inverted metamorphic multijunction solar cells due to the emissivity of the emissive coating.

11. The solar cell array of claim 10 wherein the array comprising the plurality of coated III-V compound semiconductor inverted metamorphic multijunction solar cells has an efficiency that is higher than an efficiency of an array comprising a plurality of uncoated III-V compound semiconductor inverted metamorphic multijunction solar cells.

12. A solar cell array for deployment and use in a space environment comprising a plurality of coated III-V compound semiconductor inverted metamorphic multijunction solar cells attached to a flexible supporting member to provide an array comprising the plurality of coated III-V compound semiconductor inverted metamorphic multijunction solar cells and further comprising a discrete interconnection member to provide an electrical connection between adjacent coated III-V compound semiconductor inverted metamorphic multijunction solar cells;

wherein each solar cell of the plurality of solar cells is a space solar cell designed for operation at AM0;

wherein each solar cell of the plurality of coated III-V compound semiconductor inverted metamorphic multijunction solar cells has a front surface and a backside surface, wherein each backside surface is entirely covered with a metallic backside layer comprising a sequence of layers composed of Ti/Au/Ag/Au, and further comprising an emissive coating directly on a portion of the metallic backside layer, wherein the emissive coating is formed from a coating material comprising a white room temperature vulcanizable (RTV) silicone compounded with $TiO_2$ and/or $SiO_2$ that is spray coated and cured at room temperature for at least seven days following application;

wherein the supporting member is a mesh that configures each solar cell of the plurality of coated III-V compound semiconductor inverted metamorphic multijunction solar cells such that at least a portion of each exposed coating on the backside layer is exposed to the space environment when deployed;

wherein, when exposed to sunlight, the array comprising the plurality of coated III-V compound semiconductor inverted metamorphic multijunction solar cells has a temperature that is lower than a temperature of an array comprising a plurality of uncoated III-V compound semiconductor inverted metamorphic multijunction solar cells due to the emissivity of the emissive coating; and wherein the array comprising the plurality of coated III-V compound semiconductor inverted metamorphic multijunction solar cells has an efficiency that is higher than an efficiency of an array comprising a plurality of uncoated III-V compound semiconductor inverted metamorphic multijunction solar cells.

* * * * *